US010606696B2

United States Patent
Cadigan et al.

(10) Patent No.: US 10,606,696 B2
(45) Date of Patent: Mar. 31, 2020

(54) INTERNALLY-GENERATED DATA STORAGE IN SPARE MEMORY LOCATIONS

(71) Applicant: International Business Machines Corporation, Armonk, NY (US)

(72) Inventors: David D. Cadigan, Danbury, CT (US); Stephen Glancy, Yorktown, VA (US); Frank LaPietra, Poughquag, NY (US); Kevin McIlvain, Delmar, NY (US); Jeremy R. Neaton, Fishkill, NY (US); Richard D. Wheeler, Millerton, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 184 days.

(21) Appl. No.: 15/830,054

(22) Filed: Dec. 4, 2017

(65) Prior Publication Data

US 2019/0171520 A1 Jun. 6, 2019

(51) Int. Cl.

| | |
|---|---|
| ***G11C 29/00*** | (2006.01) |
| ***G06F 11/00*** | (2006.01) |
| ***G06F 11/10*** | (2006.01) |
| ***G11C 29/52*** | (2006.01) |
| *G11C 29/04* | (2006.01) |

(52) U.S. Cl.

CPC ...... *G06F 11/1068* (2013.01); *G06F 11/1004* (2013.01); *G06F 11/1048* (2013.01); *G11C 29/52* (2013.01); *G11C 2029/0411* (2013.01)

(58) Field of Classification Search

CPC ............. G06F 11/1068; G06F 11/1004; G06F 11/1048; G11C 29/52; G11C 2029/0411

USPC ....... 714/764, 763, 766, 772, 767, 799, 746; 711/163, 100, 104, 105, 106, 111, 112

See application file for complete search history.

(56) References Cited

U.S. PATENT DOCUMENTS

| | | | |
|---|---|---|---|
| 7,653,861 | B2 | 1/2010 | Kanai et al. |
| 7,676,730 | B2 | 3/2010 | Haugan et al. |
| 9,043,569 | B2 | 5/2015 | Dell et al. |
| 9,330,737 | B2 | 5/2016 | Chinnakkonda Vidyapoornachary et al. |
| 9,431,085 | B2 | 8/2016 | Greenberg et al. |
| 9,449,671 | B2 | 9/2016 | Crawford et al. |
| 2013/0042047 | A1 | 2/2013 | Nishio |
| 2014/0344514 | A1 | 11/2014 | Kilmer et al. |
| 2015/0206558 | A1 | 7/2015 | Ni et al. |

(Continued)

OTHER PUBLICATIONS

Ahn, J. H., et al., "Multicore DIMM: An Energy Efficient Memory Module with Independently Controlled DRAMs", IEEE Computer Architecture Letters, 2009, 8(1), 5-8 (4 pp.).

(Continued)

*Primary Examiner* — Christine T. Tu

(74) *Attorney, Agent, or Firm* — Cantor Colburn LLP; Bryan Bortnick

(57) ABSTRACT

An aspect includes generating, within a first memory device of a memory system, a plurality of event-based information associated with activity in the memory system. The event-based information is stored in a reserved portion of the first memory device. The event-based information is provided to a memory controller of the memory system corresponding with an access of a memory row across a plurality of memory devices of the memory system associated with the event-based information.

14 Claims, 7 Drawing Sheets

(56) References Cited

U.S. PATENT DOCUMENTS

| | | | | |
|---|---|---|---|---|
| 2016/0085447 | A1 | 3/2016 | Park et al. | |
| 2016/0180900 | A1 | 6/2016 | Kilmer et al. | |
| 2016/0276015 | A1 | 9/2016 | Bains et al. | |
| 2017/0255512 | A1* | 9/2017 | Zamir | H03M 13/353 |
| 2018/0287636 | A1* | 10/2018 | Rom | G06F 3/0619 |

OTHER PUBLICATIONS

Aichinger, B., "DDR Memory Errors Caused by Row Hammer", High Performance Extreme Computing Conference (HPEC), 2015 IEEE, 1-5 (5 pp.).

Kim, D.H., et al., "Architectural Support for Mitigating Row Hammering in DRAM Memories", IEEE Computer Architecture Letters, 2015, 14(1), 9-12 (4 pp.).

Mutlu, O., et al., "Research Problems and Opportunities in Memory Systems", Supercomputing Frontiers and Innovations, 2014, 1(3), 19 (38 pp.).

Seyedzadeh, S. M., et al. "Counter-Based Tree Structure for Row Hammering Mitigation in DRAM", IEEE Computer Architecture Letters, 2016 (5 pp.).

Shafiee, Ali, et al. "MemZip: Exploring Unconventional Benefits from Memory Compression", 2014 IEEE 20th International Symposium on High Performance Computer Architecture (HPCA), 638-649 (12 pp).

* cited by examiner

10
MEMORY MODULE 100
CHANNEL 0
CHANNEL 1
102A
102B
106A
106B
104A
104B
I/F ECC x8
I/F ECC / SPARE x8
DATA x8
150A
150B
CH0
CH1
RCD 112
(CH0) CA BUS 108A
(CH1) CA BUS 108B
PHY
DQS
DQx8
32 BIT WIDE DATA CHANNEL/INTERFACE
MEMORY CONTROLLER 110
CIRCUITS 124
LOGIC 122
SENSOR DATA 140
MAIN MEMORY/STORAGE 130

INTERNALLY-GENERATED DATA STORAGE IN SPARE MEMORY LOCATIONS

BACKGROUND

The present invention generally relates to computer memory systems, and more specifically, to repurposing of spare locations in a memory system to store internally-generated data.

Memory subsystems may make use of multiple types of error checking, correction and reporting mechanisms to improve recoverability, availability, and serviceability (RAS) and data integrity. In higher end systems, such as mainframes, it is typical for data to be checked, corrected and reported upon in many places within write and read paths. The write and read paths can include checking, correction and reporting from a memory controller to a physical memory interface through chip packaging, board routing across a board into a memory device, and return paths. As memory technology has evolved, the amount of checking, correction, and reporting included in memory subsystems has expanded to enable higher speed and higher density technologies. Higher density technologies can be more prone to certain issues, such as charge loss.

SUMMARY

Embodiments of the present invention are directed to a method for generating and storing event-based information within a memory device of a memory system. A non-limiting example of the method includes generating, within a first memory device of a memory system, a plurality of event-based information associated with activity in the memory system. The event-based information is stored in a reserved portion of the first memory device. The event-based information is provided to a memory controller of the memory system corresponding with an access of a memory row across a plurality of memory devices of the memory system associated with the event-based information.

Embodiments of the present invention are directed to a memory system. A non-limiting example of the memory system includes a memory controller, a plurality of memory devices operably coupled to the memory controller, and a first memory device operably coupled to the memory controller. The first memory device is configured to generate, within the first memory device, a plurality of event-based information associated with activity in the memory system. The first memory device is further configured to store the event-based information in a reserved portion of the first memory device and provide the event-based information to the memory controller corresponding with an access of a memory row across the plurality of memory devices associated with the event-based information.

Embodiments of the invention are directed to a computer program product including a computer readable storage medium having program instructions embodied therewith. In a non-limiting example, the program instructions are executable by processing circuitry to cause the processing circuitry to perform generating, within a first memory device of a memory system, a plurality of event-based information associated with activity in the memory system. The program instructions are further executable by processing circuitry to cause the processing circuitry to perform storing the event-based information in a reserved portion of the first memory device and providing the event-based information to a memory controller of the memory system corresponding with an access of a memory row across a plurality of memory devices of the memory system associated with the event-based information.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

Figure 1:
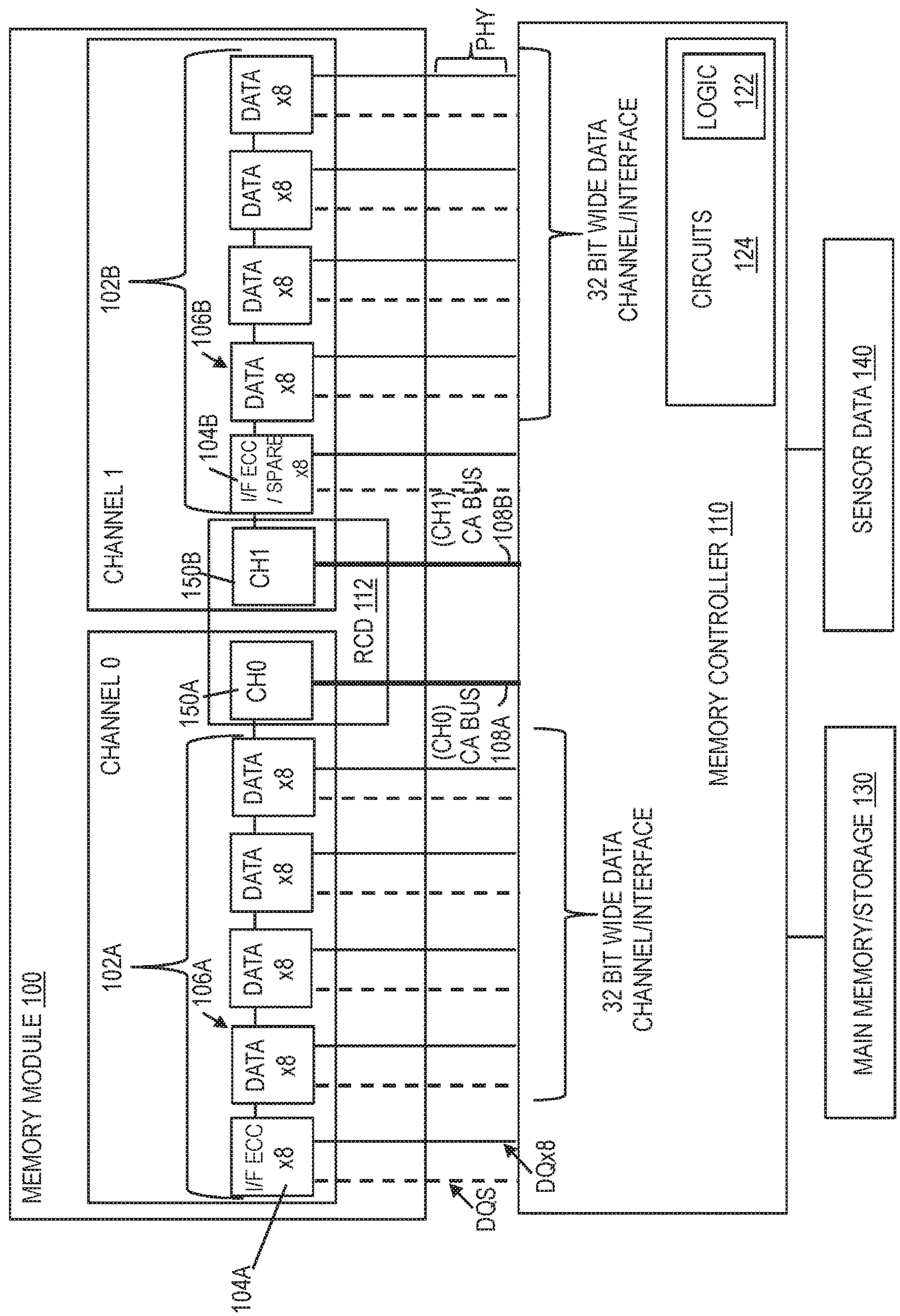
FIG. 1 depicts a system according to one or more embodiments.

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the disclosed embodiments, the various elements illustrated in the figures are provided with two or three digit reference numbers.

DETAILED DESCRIPTION

Various embodiments of the invention are described herein with reference to the related drawings. Alternative embodiments of the invention can be devised without departing from the scope of this invention. Various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. Moreover, the various tasks and process steps described herein can be incorporated into a more comprehensive procedure or process having additional steps or functionality not described in detail herein.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" may be understood to include any integer number greater than or equal to one, i.e. one, two, three, four, etc. The terms "a plurality" may be understood to include any integer number greater than or equal to two, i.e. two, three, four, five, etc. The term "connection" may include both an indirect "connection" and a direct "connection."

The terms "about," "substantially," "approximately," and variations thereof, are intended to include the degree of error associated with measurement of the particular quantity based upon the equipment available at the time of filing the application. As used herein, "one or more previously unused interface transfer bits" can refer to spare interface capacity of a previously unused bit line (e.g., a $32^{nd}$ bit line of a 32-bit interface, where 31 bit lines are already assigned to existing connections) and/or spare capacity in time, where a portion of a multi-beat is unused (e.g., spare bits in a final beat of a burst).

For the sake of brevity, conventional techniques related to making and using aspects of the invention may or may not be described in detail herein. In particular, various aspects of computing systems and specific computer programs to implement the various technical features described herein are well known. Accordingly, in the interest of brevity, many conventional implementation details are only mentioned briefly herein or are omitted entirely without providing the well-known system and/or process details.

Turning now to an overview of technologies that are more specifically relevant to aspects of the invention, dynamic random access memory (DRAM) can be implemented according to standard defining certain features for each generation. For example, double data rate fourth generation (DDR4) DRAM can use different signaling voltages, physical interfaces, clock frequencies, and the like as compared to other generations, such as DDR3 and DDR5. Error checking, correction and reporting has grown from simple parity protection across a data bus, to error correcting codes (ECC) across the data bus, to ECC across the data bus with cyclic redundancy checks (CRC) over a complete DDR burst transaction, and further ECC within each device itself. Even with this level of protection, it can still be very difficult to understand the actual root cause of a failure in a memory subsystem. The coverage can allow some insight into where the failure occurred. With an interface ECC value generated across the width of the data bus (e.g., seven bits of ECC for 32 bits of data and eight bits of ECC for 64 bits of data), an extra device is typically needed to store the generated ECC bits along with the data. The interface ECC value is generated by a memory controller with write data and can be stored on a per-beat basis (e.g., each write is a burst of eight beats, and a single write on a 64-bit data bus is an eight beat burst, each with 8 bits of ECC). When the data is read back out, each of the eight beats of the burst of data received by the memory controller can be checked against its interface ECC value.

There can also be CRC checking to protect a single write or read transaction to and from a memory device. A burst of eight beats can extend to a burst of ten beats, where the last two beats of the burst are CRC encodings. Here, on a write, the memory controller can generate the CRC and once the data and CRC reach the memory device, the device can check the CRC against the data to ensure correctness. On a read the opposite occurs, and the CRC protection covers errors on the transmission lines. Higher density memory may be prone to charge loss and therefore can have incorporated internal ECC generation and checking within each device across a rank. DRAM manufacturers can check and correct ECC internal to memory devices and report a number of errors when the number of errors reaches a certain threshold (e.g., as defined by the manufacturer). This type of internal memory ECC allows the DRAM manufacturers to build memory devices that tolerate some amount of error. The overall amount of errors and quality of the device is typically masked to users because of the blind threshold. All of these methods of error checking, correction and reporting can improve data integrity but do not allow for a better understanding of the root cause of a failure.

Turning now to an overview of the aspects of the invention, one or more embodiments of the invention address the above-described shortcomings of the prior art by repurposing unused memory locations to internally capture event-based information pertaining to memory system status and activity. Further, unused interface capacity during memory data transfers can be repurposed to communicate the internally captured event-based information.

The above-described aspects of the invention address the shortcomings of the prior art by repurposing unused memory locations in memory subsystems (e.g., low-power DDR (LPDDR), DDR4, DDR5 memory subsystems), which employ one or more data channels with ECC, such as 32 bits of data with 7 bits of ECC. Because DRAM devices typically employ one x8 or two x4 devices to support the ECC bits on one of the channels, there would be one additional bit left over in this example. This would make one bit per beat in a burst of eight beats or burst of 16 beats leaving 8 bits or 16 bits per burst transaction unused. For this unused memory, an interface ECC memory device can be modified to update the memory space with transaction information, which can later be read out. The particular information to be recorded may be configured. Such data can include but is not limited to a refresh counter, an activate counter, a read or write counter, temperature information, and the like. In some embodiments, any unused bits on any memory device can be repurposed to store event-based information. For instance, one data bit on an ECC memory device can be used, leaving a free bit on a data memory device (for a 32-bit data example). As another example, previously unused capacity of a data bit line of a memory device can be repurposed to transfer event-based information. As a further example, previously unused capacity in a beat of a multi-beat burst can be used to transfer event-based information.

Modifications to read and write mechanisms on the memory devices can be made, for instance, in ECC-related control logic within the memory devices. For example, on a read, when a memory device performs a read and an internally-generated device ECC check fails, the failure is corrected before sending the data to the memory controller, and the corrected data is written back to memory. This type of action can be performed on every read, where even if the read data were correct, the data can be written back with desired transaction information. For the write path, transaction information is written with the data, or if a transaction counter was employed, then the existing data is read from the location, the write data can be merged in, and the transaction information is updated. This allows for many variants of data to be collected. For example, if every time a write occurred, the transaction information is reset, then every time a refresh occurs, it can be counted. The counts enable a determination of information, such as the number of refreshes between a write and the first read to each row. Technical effects and benefits include capturing information pertaining to memory system activity within one or more memory devices that provide insight into failure rates, failure prevention, and memory subsystem optimization.

Turning now to a more detailed description of aspects of the present invention, FIG. 1 depicts an example of a memory system 10 according to embodiments of the invention. The memory system 10 includes a memory module 100 connected to a memory controller 110. The memory module 100 can be a DDR4 or DDR5 dual in-line memory module (DIMM). In this example, the memory module 100 has channel 0 and channel 1. Channel 0 includes memory devices 102A while channel 1 includes memory devices 102B. The memory devices 102A and 102B are each arrays of DRAM as understood by one skilled in the art. Each of the memory devices 102A and 102B are illustrated as being 8-bit wide chips with the designation "x8", which means by 8. It should be appreciated that the memory devices can be 4-bit wide chips (i.e., x4). Furthermore, although the memory module 100 is shown composed of x8 memory devices, the memory module 100 may be composed of DRAM devices (such as memory devices 102A and 102B) of other widths including x4, x8, x16, x32 or any combination. The memory devices 102A include a first memory device 104A that can be reserved for interface ECC storage and a plurality of memory devices 106A to store data values in channel 0. Similarly, memory devices 102B include a first memory device 104B that can be reserved for interface ECC storage and a plurality of memory devices 106B to store data values in channel 1. The memory module 100 in FIG. 1 is shown with two command/address busses; however, it could have one or more command/address busses. Further, although described in reference to a DDR5 bus, it will be understood that embodiments can be implemented on any memory bus or communication system that has unused transfer capacity in a bit line or beat when data is being transmitted, and event based information, as described herein, can be added to the previously unused transfer capacity.

Channels are the highest level structure at the local memory controller level. Computers can have two, three, or more channels, but two channels are illustrated in this example. Each memory device 102A in channel 0 has a matching memory device 102B in the same location in channel 1.

The first memory device 104A is configured to provide error protection for the data values of memory devices 106A for channel 0. The first memory device 104B is configured to provide error protection for the data values of memory devices 106B for channel 1. In the memory module 100, there are two 32-bit data paths per channel for channel 0 and channel 1. This means that the four memory devices 106A in channel 0 provide a 32-bit wide data interface (x32 data per channel) to the memory controller 110, and the four memory devices 106B in channel 1 provide a 32-bit wide data interface (x32 data per channel) to the memory controller 110 for reading or writing. The burst length (BL) can be 16, where over one read or write there are 16 transfers (beats) of 32 bits of data, for a total data transfer of 64 bytes. For a single ECC memory device (such as the first memory device 104A, 104B), an error correcting code over 32 bits of data requires 7 bits of ECC memory such that an additional 8 bit (x8) ECC memory device is needed per channel. Therefore, a single ECC memory device (such as the first memory device 104A, 104B) can only protect a single channel (32-bit data channel). Accordingly, the first memory device 104A protects the data of four memory devices 106A (i.e., protects 32-bit data channel which is 4×8=32-bits), and the first memory device 104B protects the data of four memory devices 106B (i.e., protects 32-bit data channel). Therefore, the memory module 100 includes two ECC memory devices which are illustrated as first memory device 104A, 104B of channels 0 and 1.

The data stored in memory devices 106A and 106B are protected by the error correcting codes (ECC) stored within the first memory device 104A, 104B at the interface level for read and write transactions. ECC values are commonly used with many types of computer data storage to detect and correct the most common kinds of data corruption. Problems can be mitigated by using DRAM modules that include extra memory bits (for ECC in the first memory device 104A, 104B) and the memory controller 110 that exploits these bits. These extra bits can be used to record parity (i.e., use an error correcting code). Parity allows the detection of all single-bit errors (or any odd number of wrong bits). The most common error correcting code, a single-error correction and double-error detection (SECDED) Hamming code, allows a single-bit error to be corrected and (in the usual configuration, with an extra parity bit) double-bit errors to be detected. The ECC in the first memory device 104A, 104B is computed and checked as an interface value per beat by the memory controller 110.

A registering/register clock driver (RCD) 112 may be connected to both channel 0 and channel 1. The RCD 112 can be a chip on the memory module 100. The RCD 112 can be configured for routing and loading to the memory devices 102A on channel 0 via channel 0 command/address (CA) bus 108A and routing and loading to memory devices 102B on channel 1 via channel 1 CA bus 108B. The RCD 112 may also be a buffer device. The RCD 112 can be connected to the memory devices 102A (including the both data memory devices and the ECC memory device). The RCD 112 can be connected to the memory devices 102B (including the both data memory devices and the ECC memory device).

The RCD 112 can include logic 150A for controlling channel 0 and logic 150B for controlling channel 1. In normal dual channel mode, the channel 0 logic 150A passes along the command and address information from memory controller 110 to the desired memory devices 102A on one side (channel 0) of the DIMM and the channel 1 logic 150B passes along the command and address information from memory controller 110 to the desired memory devices 102B on the other side (channel 1).

The memory controller 110 can be configured to communicate with the memory module 100 via the command/address (CA) lines (which are CH0 bus 108A, CH1 bus 108B) to the RCD 112. Read and write commands are issued from the memory controller 110 to the RCD 112 for channel 0 via logic 150A and issued from the memory controller 110 to the RCD 112 for channel 1 via logic 150B. For example, a write could be occurring on channel 0 (via CH0 bus 108A) while a read is occurring on channel 1 (via CH1 bus 108B)

of the memory module 100. The memory controller 110 can be a DDR5 memory controller with a physical layer interface (PHY) to connect to the memory module 100 (e.g., DDR5 DIMM). Each of the memory devices 102A and 102B are connected to the memory controller 110 via DQS and DQx8, where DQS is a data strobe and DQx8 is data lines by 8 bits in FIG. 1.

The memory controller 110 can be configured with circuits 124 as hardware to function as discussed herein. The circuits 124 can include logic 122, buffers, etc., to operate as described herein. The memory controller 110 includes standard hardware to operatively connect to the memory module 100 and a central processing unit (i.e., processor not shown) as understood by one skilled in the art. In one case, the logic 122 can include firmware and/or millicode such that the circuits 124 execute the logic 122 to operate as described herein. The logic 122 can be in the form of executable instructions, application specific integrated circuits (ASIC), etc. The memory controller 110 can interface with other system elements, such as storage 130 (e.g., main memory) and can receive sensor data 140 from one or more sensors, such as temperature sensors, current sensors, voltage sensors, and the like.

In some embodiments, the memory controller 110 can be configured to drive the same command and address (CA) to both channels 0 and 1 (via busses 108A and 108B) creating a single double-wide channel in which the first memory device 104B of channel 1 is a reconfigured as a spare memory device with interface ECC values for memory devices 106A, 106B stored in the first memory device 104A of channel 0. It should be appreciated that the memory controller 110 can be configured to run in either two 32-bit data channels with 7 bit ECC code (i.e., dual channel mode) and switch to a single 64-bit channel with an 8 bit ECC code and 8 bit spare memory device (i.e., single channel mode), when using a standard DDR5 DIMM (memory module 100). With typical SECDED (single error correct, dual error detect) ECC coding, the number of bits required to detect and correct fails reduces and the number of bits being checked increases. To cover 32 bits of data with SECDED ECC, seven bits of ECC code are required, and to cover 64 bits of data with SECDED ECC, only one more bit of ECC code is required for a total of 8 bits. Dual channel mode can issue command and address information separately and independently on the CH0 bus 108A and CH1 bus 108B. Single channel mode issues the same command and address information on both CH0 bus 108A and CH1 bus 108B.

Figure 2:
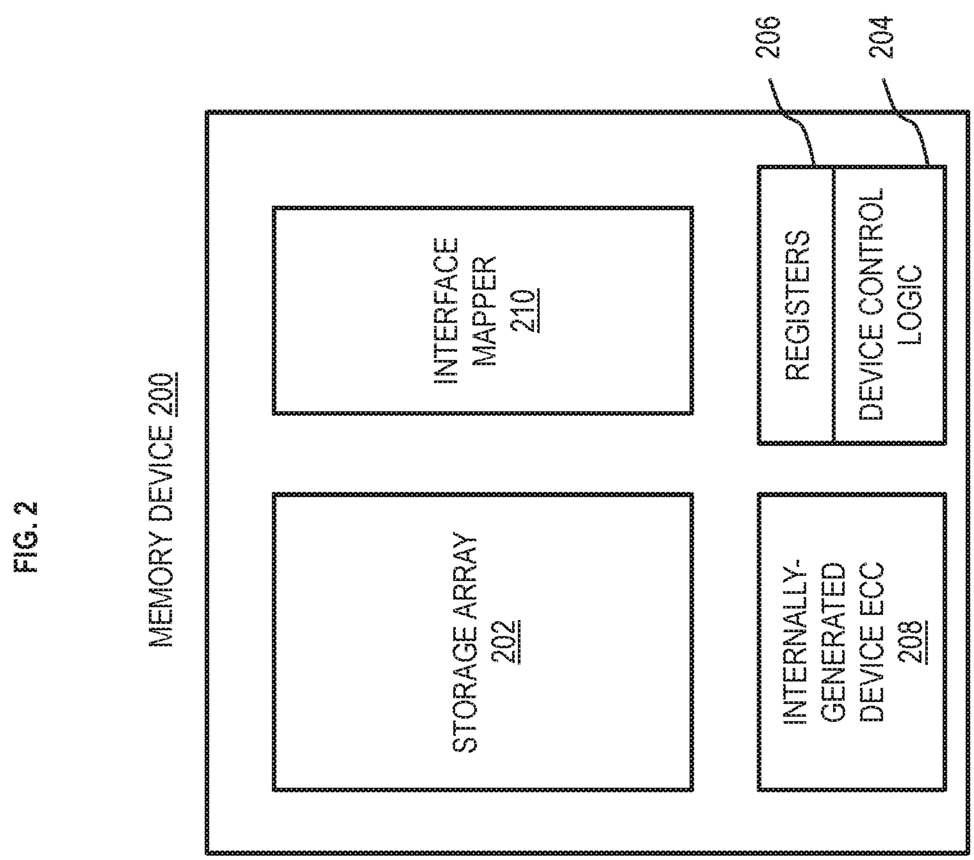
FIG. 2 depicts a memory device according to one or more embodiments.

FIG. 2 depicts a memory device 200 as an embodiment of the memory devices 102A, 102B of FIG. 1. The memory device 200 includes a storage array 202 operable to dynamically store values while the memory device 200 is powered using DRAM storage techniques known in the art. The memory device 200 can also include device control logic 204 operable to control timing and control signals within the memory device 200. Registers 206 within the memory device 200 can set a mode of operation and various configuration parameters, such as refresh timing, refresh source, calibration, and various interface parameters. In the example of FIG. 2, the memory device 200 includes an internally-generated device ECC 208. Upon a read request from the memory controller 110 of FIG. 1, the device control logic 204 can perform a check of the values read from the storage array 202 using the internally-generated device ECC 208 to detect and correct errors before outputting the values read. The internally-generated device ECC 208 differs from the interface-level ECC held in the first memory device 104A, 104B in that the internally-generated device ECC 208 corrects errors locally within the memory device 200, while the interface ECC is computed by the memory controller 110 of FIG. 1 for transactions across a bus interface of multiple memory devices 106A, 106B.

In some embodiments, the one of the bits of the memory device 200 may not be physically connected to the memory controller 110 of FIG. 1. For example, if a 7-bit interface ECC value is used, then 1 bit on the first memory device 104A, 104B may not be wired. In this case, an interface mapper 210 can be included within the memory device 200 to access locations in the storage array 202 that would otherwise be inaccessible due to omission of a physical connection to one of the bits. For example, a mode register in the registers 206 can be selectively configured to shift one or more bit paths from the storage array 202 to external connections of the memory device 200 (e.g., shift output intended for disconnected bit line DQ7 to connected bit line DQ0 responsive to a mode selection). Locations that were not typically available and were reserved as spare locations in the storage array 202 can be used to store event-based information, including results of the internally-generated device ECC 208, access counters, refresh counters, and other such information. It will be understood that the memory device 200 includes other elements (not depicted) known in the art of DRAM devices.

Figure 3:
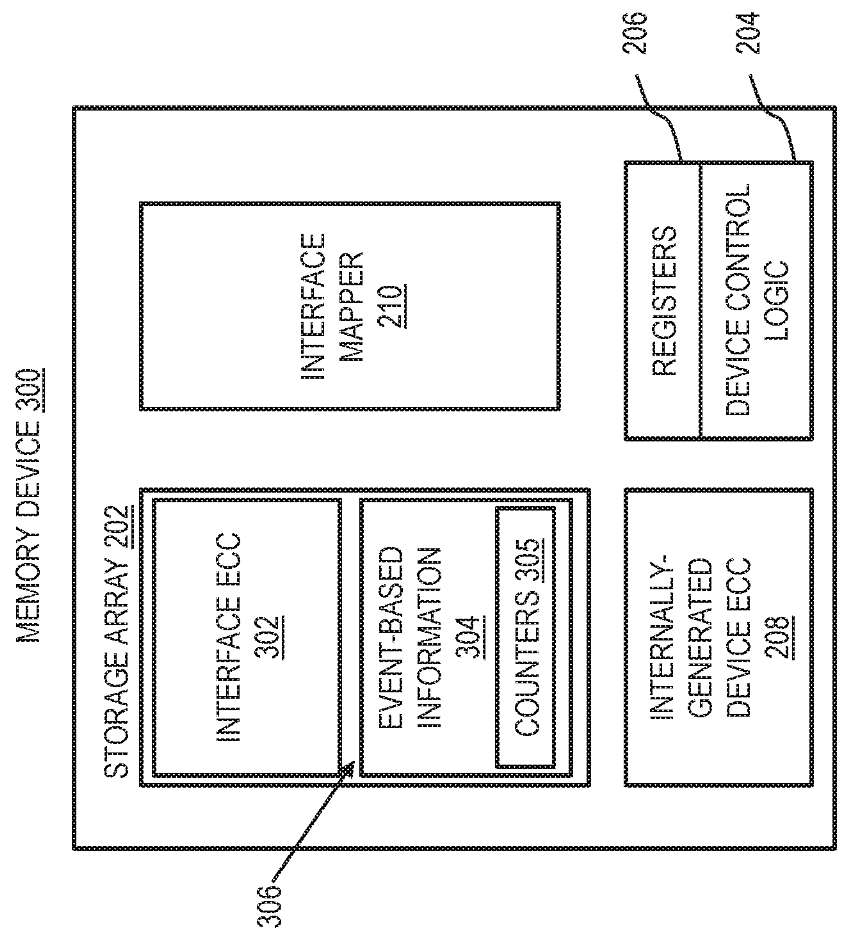
FIG. 3 depicts a memory device according to one or more embodiments.

FIG. 3 depicts another example of a memory device 300 as an embodiment of the first memory device 104A, 104B of FIG. 1. Similar to the example of FIG. 2, the memory device 300 includes a storage array 202, device control logic 204, registers 206, internally-generated device ECC 208, and interface mapper 210. FIG. 3 illustrates event-based information 304 stored in a reserved portion 306 of the memory device 300. For example, if 7-bits of an 8-bit interface are needed for storing interface ECC 302 values, the locations that map to the otherwise unused (spare) eighth bit in the reserved portion 306 of the memory device 300 are used to store event-based information 304. In some embodiments, the event-based information 304 can include a combination of externally generated information, such as the state of sensor data 140 at the time of a most recent access, and internally-generated data values produced within the memory device 300. The registers 206 can be configured through the memory controller 110 of FIG. 1 to select one or more transaction types to monitor, a threshold for incrementing counters 305 in the event-based information 304, and other such information. Counters 305 in the event-based information 304 can enable a determination of information, such as the number of refreshes between a write and the first read to each row in the storage array 202. Since a common design is used for memory devices 102A, 102B, an activity counter within the first memory device 104A, 104B can correspondingly track an access of a memory row across the memory devices 106A, 106B forming an association with the same event-based based information on a per beat basis or per burst basis.

Figure 4:
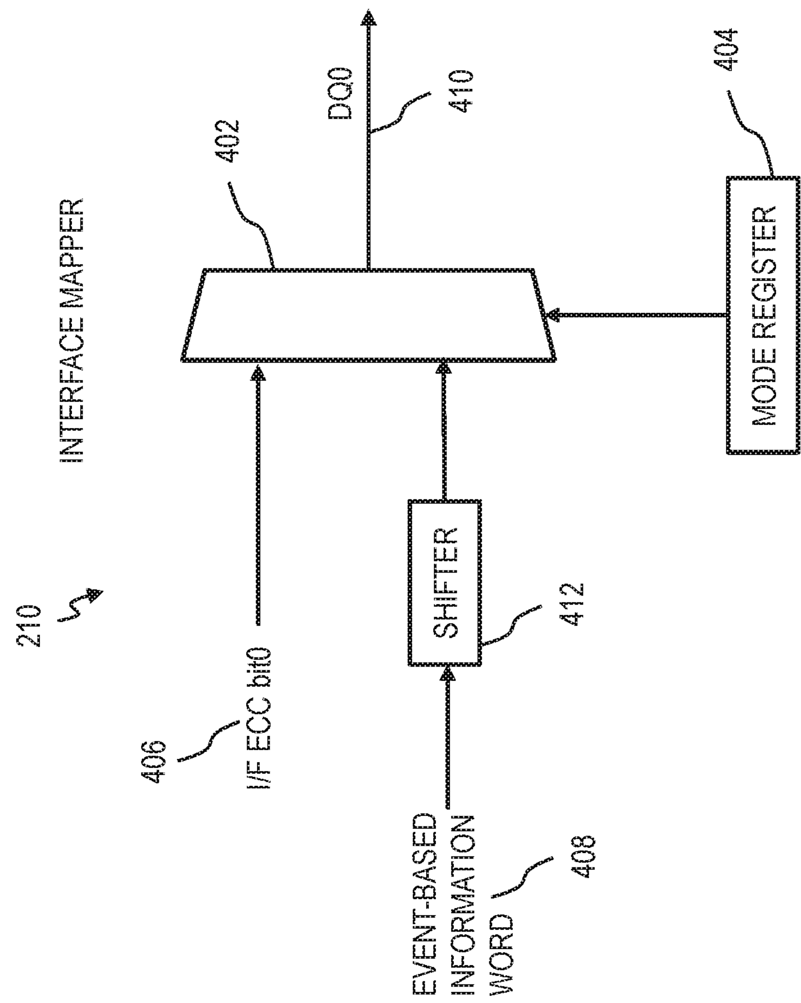
FIG. 4 depicts an interface mapper according to one or more embodiments.

Per beat basis tracking can be used when a larger number of spare locations are available for storing the event-based information 304, such as when the first memory device 104B of channel 1 is remapped as a fully spare device (no interface ECC 302) and the first memory device 104A of channel 0 is only used to store interface ECC 302 for a 64-bit combined data bus. When managed as separate channels, the first memory device 104A, 104B of channels 0 and 1 can each store, for example, a 16-bit value (or two 8-bit values) per burst in the event-based information 304. If interface remapping is needed due to a reduced number of bit line connections, then as depicted in FIG. 4, a multiplexer 402 of the interface mapper 210 can select, based on the state of a mode register 404 of registers 206, between an interface ECC bit 406 and an event-based information word 408 of the event-based information 304 to output on a bit line 410 to the memory controller 110 of FIG. 1. The interface mapper 210 can include a shifter 412 to send one bit out per beat such that 16 bits are transferred in a 16-beat burst. Other mappings are contemplated using various combinations of bit lines, word sizes, bus widths, and burst sizes.

Figure 5:
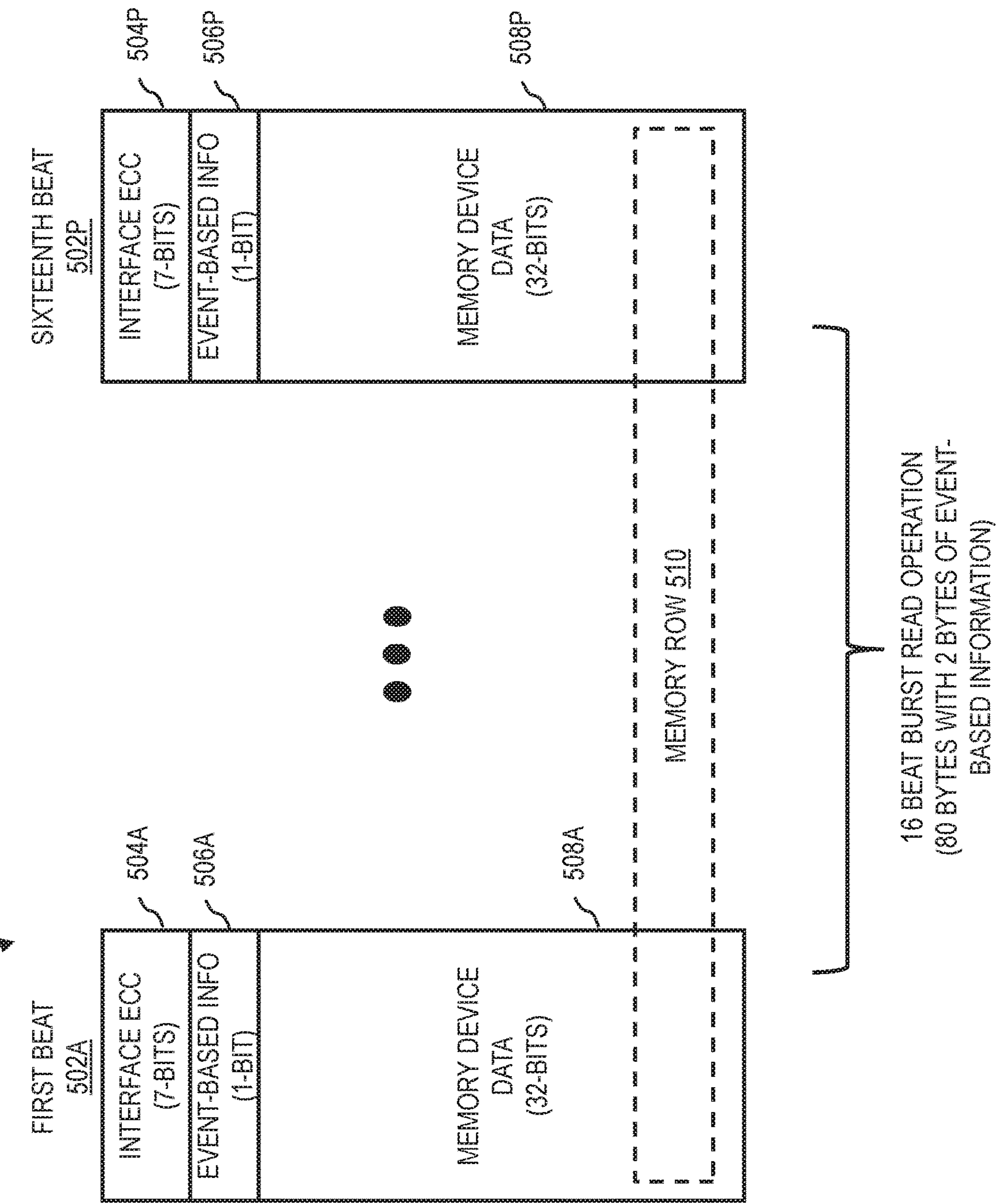
FIG. 5 depicts a burst read operation according to one or more embodiments.

FIG. 5 depicts an example of a burst read operation 500 with sixteen beats (first beat 502A to sixteenth beat 502P). In the example of FIG. 5, a 40-bit bus is used per channel, including 32 bits of memory device data, 7 bits of interface ECC, and 1 bit of event-based information per beat. Each value of the interface ECC aligns with memory device data in the same beat. For example, an interface ECC 504A of the first beat 502A provides error detection and correction capability for memory device data beat 508A, while interface ECC 504P provides error detection and correction capability for memory device data beat 508P in the sixteenth beat 502P. The event-based information is spread in 1-bit per beat across the burst read operation 500 collectively between a first bit of event based information 506A in the first beat 502A to a sixteenth bit of event-based information 506P in the sixteenth beat 502P. The event based information 506A-506P represents one or more previously unused interface transfer bits. Thus, by collecting bit values across the burst read operation 500, the memory controller 110 of FIG. 1 can be provided with up to 16 bits of event-based information 304 of FIG. 3 per burst associated with an access of a memory row 510 across memory devices 106A, 106B as captured in the 64 bytes of memory device data beats 508A-508P. This also results in essentially “free” transfers of the event-based information 304 of FIG. 3 since the 40-bit bus is not fully utilized with only 32 bits of memory device data and 7 bits of interface ECC per transfer with one previously unused interface transfer bit.

Figure 6:
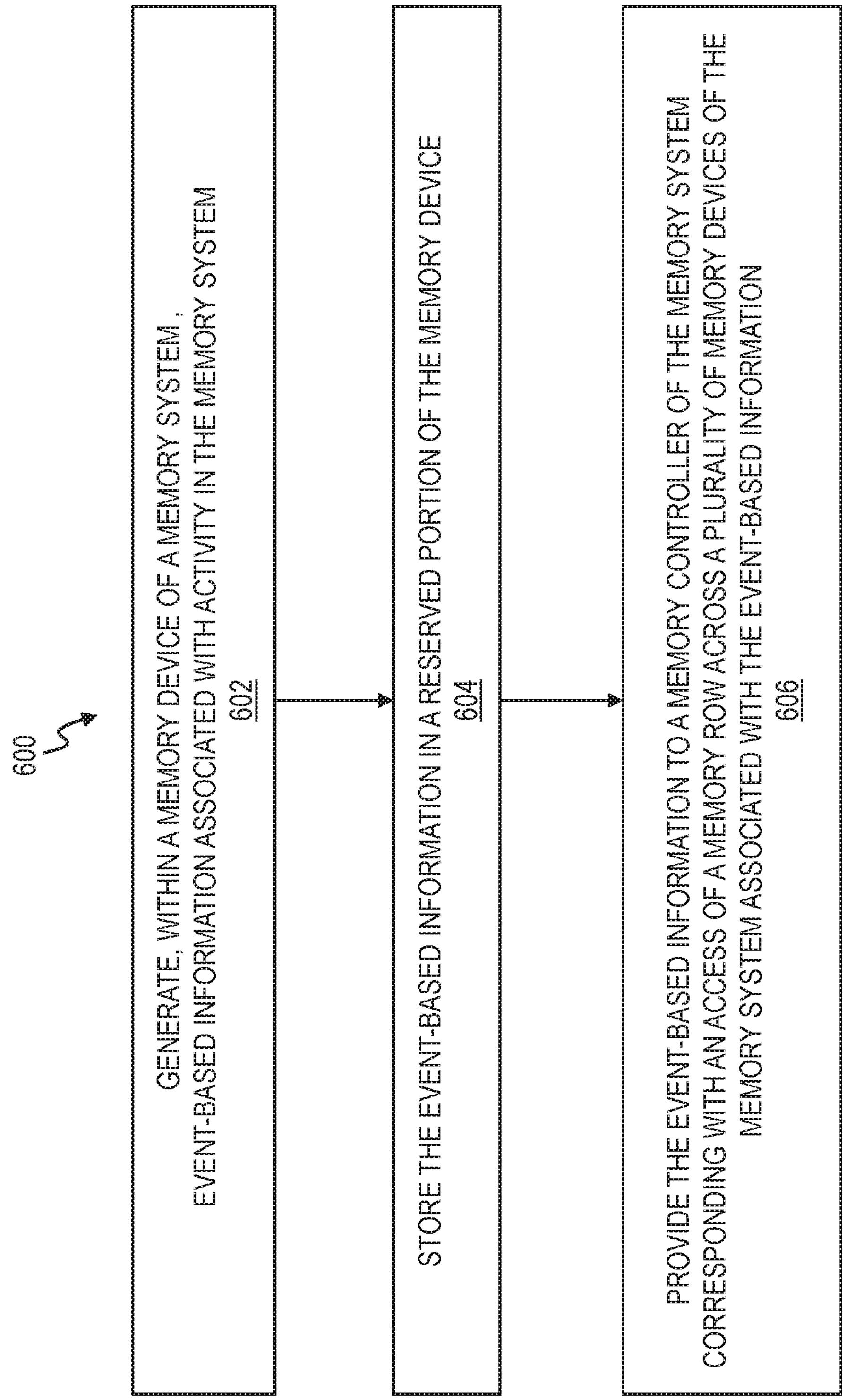
FIG. 6 depicts an example process flow according to one or more embodiments.

Turning now to FIG. 6, a flow diagram of a process 600 is generally shown in accordance with an embodiment. The process 600 is described with reference to FIGS. 1-5 and may include additional steps beyond those depicted in FIG. 6.

At block 602, a plurality of event-based information 304 is generated within a first memory device 104A, 104B of a memory system 10, where the event-based information 304 is associated with activity in the memory system 10. In some embodiments, one or more sensor data 140 values are stored in the event-based information 304, such as temperature, voltage, or current readings. As one example, where 16 bits are available per memory row 510, an internally-generated event counter can occupy 8 bits, and a value of sensor data 140 captured at a corresponding access time can occupy 8 bits for the memory row 510. Including sensor data 140 can assist in later troubleshooting to determine whether possible heat or power supply related issues correlate to events, such as a change in error rate.

At block 604, the event-based information 304 is stored in a reserved portion 306 of the first memory device 104A, 104B. An interface ECC 302 for the memory row 510 in the first memory device 104A, 104B can be stored in combination with the event-based information 304, where the interface ECC 302 is computed across the memory devices 106A, 106B by the memory controller 110.

An internally-generated device ECC 208 can be stored in the first memory device 104A, 104B and in each of the plurality of memory devices 106A, 106B. The internally-generated device ECC 208 can be checked in the first memory device 104A, 104B and in each of the plurality of memory devices 106A, 106B upon a read operation. An error detected in a value read from the first memory device 104A, 104B or the plurality of memory devices 106A, 106B can be internally corrected by device control logic 204 based on the internally-generated device ECC 208 prior to sending the value to the memory controller 110. The event-based information 304 can be updated based on an access to the internally-generated device ECC 208 in the first memory device 104A, 104B. For example, when a value of the interface ECC 302 is corrected internally based on the internally-generated device ECC 208, one or more counters 305 in the event-based information 304 can be updated as well.

At block 606, the event-based information 304 is provided to the memory controller 110 of the memory system 10 corresponding with an access of a memory row 510 across a plurality of memory devices 106A, 106B of the memory system 10 associated with the event-based information 304. For example, the event-based information 304 can be provided in one or more previously unused interface transfer bits and/or as data bits directly accessible through read operations. The memory controller 110 can use the event based information to update the schedule of refresh operations and/or trigger a modification to a power supply parameter, such as a fan speed, based on the event-based information 304. The plurality of memory devices 106A, 106B can store data, and the event-based information 304 may be transferred across a plurality of beats of a multi-beat burst to the memory controller 110 including data from the memory row 510 and the interface ECC 302 as depicted in the example of FIG. 5 with respect to the burst read operation 500.

In some embodiments, an interface of the first memory device 104A, 104B can be dynamically remapped using interface mapper 210 to switch between outputting the interface ECC 302 and the event-based information 304 on a bit line of the first memory device 104A, 104B. The event-based information 304 can include a counter, and the process 600 can include updating the counter based on accessing the memory row 510. The counter can be incremented internally within the first memory device 104A, 104B based on a refresh of the memory row 510. The counter can be reset based on a write to the memory row 510.

Figure 7:
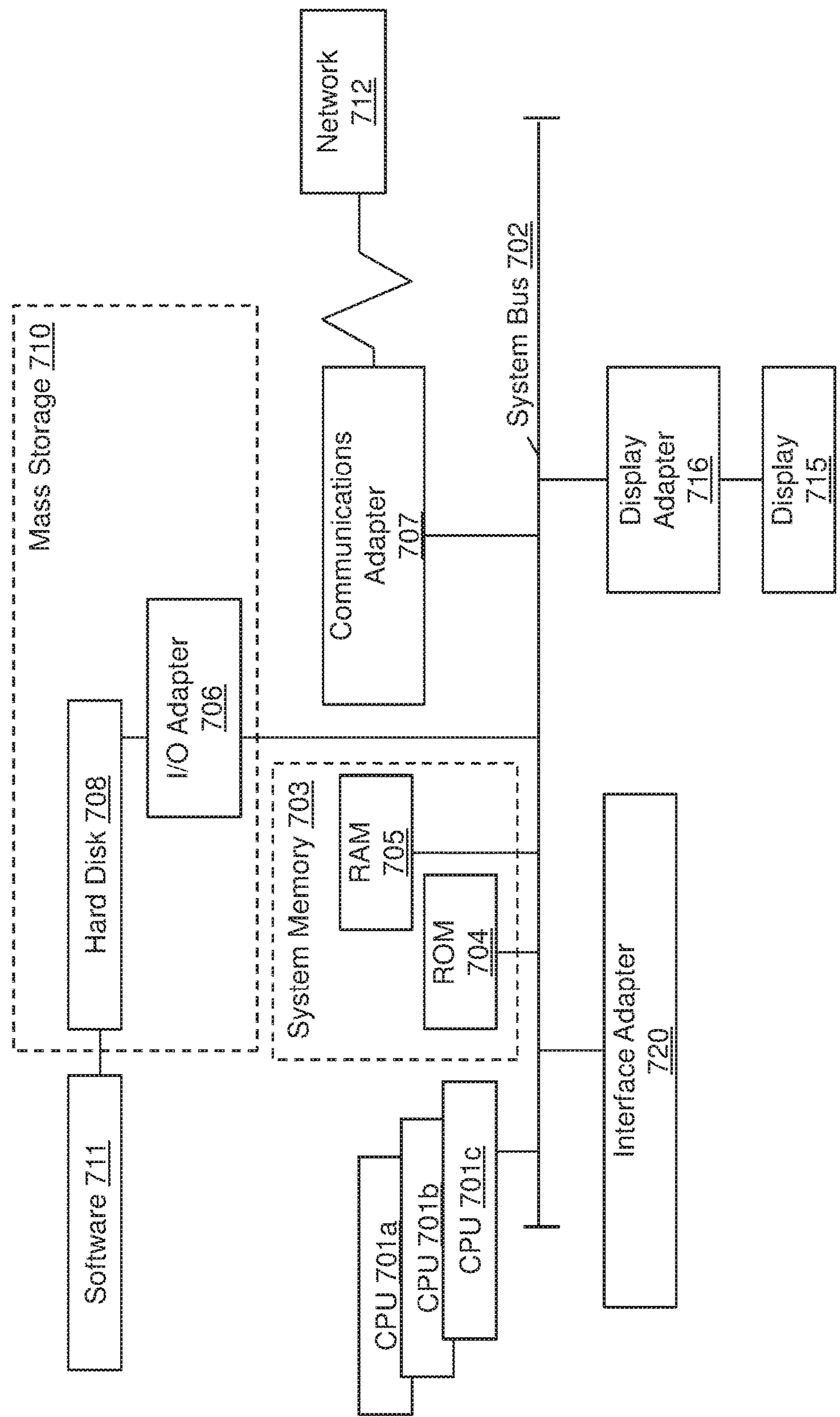
FIG. 7 depicts a processing system in accordance with one or more embodiments.

Referring now to FIG. 7, there is shown an embodiment of a processing system 700 for implementing the teachings herein. In this embodiment, the processing system 700 has one or more central processing units (processors) 701*a*, 701*b*, 701*c*, etc. (collectively or generically referred to as processor(s) 701). The processors 701, also referred to as processing circuits/circuitry, are coupled via a system bus 702 to a system memory 703 and various other components. The system memory 703 can include read only memory (ROM) 704 and random access memory (RAM) 705. The ROM 704 is coupled to system bus 702 and may include a basic input/output system (BIOS), which controls certain basic functions of the processing system 700. RAM 705 is read-write memory coupled to system bus 702 for use by the processors 701 and can include the memory system 10 of FIG. 1.

FIG. 7 further depicts an input/output (I/O) adapter 706 and a communications adapter 707 coupled to the system bus 702. I/O adapter 706 may be a small computer system interface (SCSI) adapter that communicates with a hard disk 708 and/or any other similar component. I/O adapter 706 and hard disk 708 are collectively referred to herein as mass storage 710. Software 711 for execution on the processing system 700 may be stored in mass storage 710. The mass storage 710 is an example of a tangible storage medium readable by the processors 701, where the software 711 is stored as instructions for execution by the processors 701 to perform a method, such as supporting execution of the process 600 of FIG. 6. Communications adapter 707 interconnects the system bus 702 with an outside network 712 enabling processing system 700 to communicate with other such systems. A display 715 is connected to system bus 702 via a display adapter 716, which may include a graphics controller to improve the performance of graphics intensive applications and a video controller. In one embodiment, adapters 706, 707, and 716 may be connected to one or more I/O buses that are connected to the system bus 702 via an intermediate bus bridge (not shown). Suitable I/O buses for connecting peripheral devices such as hard disk controllers, network adapters, and graphics adapters typically include common protocols, such as PCI. Additional input/output devices can be connected to the system bus 702 via an interface adapter 720 and the display adapter 716. A keyboard, mouse, speaker can be interconnected to the system bus 702 via the interface adapter 720, which may include, for example, a Super I/O chip integrating multiple device adapters into a single integrated circuit.

Thus, as configured in FIG. 7, the processing system 700 includes processing capability in the form of processors 701, and, storage capability including the system memory 703 and the mass storage 710, input means such as keyboard and mouse, and output capability including speaker and the display 715. In one embodiment, a portion of the system memory 703 and the mass storage 710 collectively store an operating system, such as the z/OS or AIX operating system from IBM Corporation, to coordinate the functions of the various components shown in FIG. 7.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instruction by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method comprising:

generating, within a first memory device of a plurality of memory devices of a memory system, a plurality of event-based information associated with activity in the memory system, wherein the memory devices are connected in parallel to a memory controller by a bus and accessed in parallel as part of a burst read operation;

storing the event-based information in a reserved portion of the first memory device;

providing the event-based information from the reserved portion of the first memory device to the memory controller as part of the burst read operation corresponding with an access of a memory row across the plurality of memory devices; and storing an interface error correcting code (ECC) for the memory row in the first memory device in combination with the event-based information, wherein the interface e ECC is computed by the memory controller based on data stored across the memory devices of the memory row as part of a write operation, wherein the plurality of memory devices store data, and the event-based information is transferred across a plurality of beats of a multi-beat burst to the memory controller, each beat is part of the burst read operation including data from the memory row, the interface ECC, and the event-based information, and each of the beats comprises a multi-bit transfer on the bus between the memory devices and the memory controller.

2. The method of claim 1, further comprising:

storing an internally-generated device ECC in the first memory device and in each of the plurality of memory devices as part of the write operation, wherein the internally-generated device ECC is computed on a per memory device basis;

checking the internally-generated device ECC in the first memory device and in each of the plurality of memory devices upon a read operation; and internally correcting an error detected in a value read from the first memory device or the plurality of memory devices based on the internally-generated device ECC prior to sending the value to the memory controller.

3. The method of claim 2, wherein the event-based information is updated based on an access to the internally-generated device ECC in the first memory device.

4. The method of claim 1, further comprising:

dynamically remapping an interface within the first memory device to switch between outputting the interface ECC and the event-based information to a bit line of the first memory device, wherein the bit line is part of the bus between the memory devices and the memory controller.

5. The method of claim 1, wherein the event-based information comprises a counter and the method further comprises:

updating the counter based on accessing the memory row;

incrementing the counter internally within the first memory device based on a refresh of the memory row; and resetting the counter based on a write to the memory row.

6. The method of claim 1, further comprising:

storing one or more sensor values in the event-based information.

7. A memory system comprising:

a memory controller;

a plurality of memory devices operably coupled to the memory controller via a bus, wherein the memory devices are accessed in parallel as part of a burst read operation; and a first memory device of the memory devices operably coupled to the memory controller, the first memory device configured to:

generate, within the first memory device, a plurality of event-based information associated with activity in the memory system;

store the event-based information in a reserved portion of the first memory device;

provide the event-based information to the memory controller as part of the burst read operation corresponding with an access of a memory row across the plurality of memory devices; and store an interface error correcting code (ECC) for the memory row in combination with the event-based information, wherein the interface e ECC is computed by the memory controller based on data stored across the memory devices of the memory row as part of a write operation, wherein the plurality of memory devices store data, and the event-based information is transferred across a plurality of beats of a multi-beat burst to the memory controller, each beat is part of the burst read operation including data from the memory row, the interface ECC, and the event-based information, and each of the beats comprises a multi-bit transfer on the bus between the memory devices and the memory controller.

8. The memory system of claim 7, wherein the memory system is further configured to:

store an internally-generated device ECC in the first memory device and in each of the plurality of memory devices as part of the write operation, wherein the internally-generated device ECC is computed on a per memory device basis;

check the internally-generated device ECC in the first memory device and in each of the plurality of memory devices upon a read operation; and internally correct an error detected in a value read from the first memory device or the plurality of memory devices based on the internally-generated device ECC prior to sending the value to the memory controller.

9. The memory system of claim 8, wherein the event-based information is updated based on an access to the internally-generated device ECC in the first memory device.

10. The memory system of claim 7, wherein the first memory device is further configured to dynamically remap an interface within the first memory device to switch between outputting the interface ECC and the event-based information to a bit line of the first memory device, wherein the bit line is part of the bus between the memory devices and the memory controller.

11. The memory system of claim 7, wherein the event-based information comprises a counter, the counter is updated based on accessing the memory row, the counter is incremented internally within the first memory device based on a refresh of the memory row, and the counter is reset based on a write to the memory row.

12. The memory system of claim 7, wherein one or more sensor values are stored in the event-based information.

13. A computer program product comprising a non-transitory computer readable storage medium having program instructions embodied therewith, the program instructions executable by processing circuitry to cause the processing circuitry to perform:

generating, within a first memory device of a plurality of memory devices of a memory system, a plurality of event-based information associated with activity in the memory system, wherein the memory devices are connected in parallel to a memory controller by a bus and accessed in parallel as part of a burst read operation;

storing the event-based information in a reserved portion of the first memory device;

providing the event-based information from the reserved portion of the first memory device to the memory controller as part of the burst read operation corresponding with an access of a memory row across the plurality of memory devices; and storing an interface error correcting code (ECC) for the memory row in the first memory device in combination with the event-based information, wherein the interface e ECC is computed by the memory controller based on data stored across the memory devices of the memory row as part of a write operation, wherein the plurality of memory devices store data, and the event-based information is transferred across a plurality of beats of a multi-beat burst to the memory controller, each beat is part of the burst read operation including data from the memory row, the interface ECC, and the event-based information, and each of the beats comprises a multi-bit transfer on the bus between the memory devices and the memory controller.

14. The computer program product of claim 13, wherein the program instructions executable by processing circuitry further cause the processing circuitry to perform:

storing an interface error correcting code (ECC) for the memory row in the first memory device in combination with the event-based information, wherein the interface ECC is computed by the memory controller based on data stored across the memory devices of the memory row as part of a write operation;

storing an internally-generated device ECC in the first memory device and in each of the plurality of memory devices as part of the write operation, wherein the internally-generated device ECC is computed on a per memory device basis;

checking the internally-generated device ECC in the first memory device and in each of the plurality of memory devices upon a read operation; and internally correcting an error detected in a value read from the first memory device or the plurality of memory devices based on the internally-generated device ECC prior to sending the value to the memory controller.

* * * * *